(12) United States Patent
Subburaj et al.

(10) Patent No.: US 12,265,149 B2
(45) Date of Patent: Apr. 1, 2025

(54) SYSTEM AND METHOD FOR THE COMPRESSION OF ECHOLOCATION DATA

(71) Applicant: TEXAS INSTRUMENTS INCORPORATED, Dallas, TX (US)

(72) Inventors: Karthik Subburaj, Bangalore (IN); Sandeep Rao, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 541 days.

(21) Appl. No.: 17/405,303

(22) Filed: Aug. 18, 2021

(65) Prior Publication Data
US 2022/0236399 A1 Jul. 28, 2022

Related U.S. Application Data

(60) Provisional application No. 63/184,979, filed on May 6, 2021.

(30) Foreign Application Priority Data

Jan. 27, 2021 (IN) .............................. 202141003802

(51) Int. Cl.
G01S 13/58 (2006.01)
G01S 13/42 (2006.01)

(52) U.S. Cl.
CPC ............ G01S 13/584 (2013.01); G01S 13/42 (2013.01)

(58) Field of Classification Search
CPC ............................... G01S 13/584; G01S 13/42
USPC ........................................................ 342/109
See application file for complete search history.

(56) References Cited

U.S. PATENT DOCUMENTS

| 4,254,482 A | * | 3/1981 | Newman | ................. G01S 15/88 367/87 |
| 5,043,734 A | * | 8/1991 | Niho | .................... G01S 13/9019 342/197 |
| 5,638,281 A | * | 6/1997 | Wang | ...................... G01S 7/021 342/29 |
| 5,872,628 A | * | 2/1999 | Erskine | ................... G01S 17/58 356/4.09 |

(Continued)

FOREIGN PATENT DOCUMENTS

| CN | 102621547 A | 8/2012 |
| CN | 102288941 B | 4/2014 |

(Continued)

OTHER PUBLICATIONS

China Search Report mailed Mar. 23, 2021.

(Continued)

*Primary Examiner* — Nuzhat Pervin
(74) *Attorney, Agent, or Firm* — Michael T. Gabrik; Frank D. Cimino

(57) ABSTRACT

A method for compressing echolocation data is provided. The method includes dividing the echolocation data into a plurality of partitions, and selecting a first partition for processing. The method also includes combining echolocation data from the first partition with echolocation data within a second partition, and combining echolocation data from the first partition with echolocation data within a third partition. The method further includes storing the combined echolocation data for all of the plurality of partitions except for the first partition in a memory.

21 Claims, 6 Drawing Sheets

(56) References Cited

U.S. PATENT DOCUMENTS

| | | | | |
|---|---|---|---|---|
| 5,923,285 | A * | 7/1999 | Andrusiak | G01S 7/003 342/185 |
| 6,314,192 | B1 * | 11/2001 | Chen | H04N 1/32251 382/100 |
| 6,888,490 | B1 * | 5/2005 | Brovko | G01S 13/904 342/25 R |
| 7,245,250 | B1 * | 7/2007 | Kalayeh | G01S 13/9017 342/25 R |
| 8,686,898 | B2 * | 4/2014 | Beasley | G01S 7/354 342/195 |
| 9,357,223 | B2 * | 5/2016 | Xu | H04N 19/593 |
| 9,497,466 | B2 * | 11/2016 | Cheng | H04N 19/423 |
| 9,501,717 | B1 * | 11/2016 | Boufounos | G06T 1/0007 |
| 9,541,637 | B2 * | 1/2017 | Searcy | H03M 7/30 |
| 9,562,968 | B2 * | 2/2017 | Wu | G01S 3/74 |
| 9,599,702 | B1 * | 3/2017 | Bordes | G01S 13/18 |
| 9,977,115 | B2 * | 5/2018 | Park | G01S 7/032 |
| 10,230,986 | B2 * | 3/2019 | Xu | H04N 19/51 |
| 10,592,531 | B2 * | 3/2020 | Koochakzadeh | G06F 16/278 |
| 10,810,206 | B2 * | 10/2020 | Sivathanu | G06F 11/1469 |
| 10,866,306 | B2 * | 12/2020 | Maher | G11C 11/409 |
| 11,112,497 | B2 * | 9/2021 | Villeval | G01S 13/584 |
| 11,138,172 | B2 * | 10/2021 | Stute | G06F 16/278 |
| 11,165,865 | B2 * | 11/2021 | Stute | G06F 16/278 |
| 2003/0156054 | A1 * | 8/2003 | Ishii | G01S 7/003 342/111 |
| 2004/0165478 | A1 * | 8/2004 | Harmon, Jr. | G01V 1/003 367/87 |
| 2007/0164894 | A1 * | 7/2007 | Sherman | G01S 13/9011 342/25 F |
| 2008/0272957 | A1 * | 11/2008 | Schoeberl | G01S 13/584 342/104 |
| 2008/0304044 | A1 * | 12/2008 | Cooper | G01S 13/89 356/5.15 |
| 2010/0061455 | A1 * | 3/2010 | Xu | H04N 19/436 375/240.23 |
| 2010/0268083 | A1 * | 10/2010 | McLaughlin | G01N 29/06 600/443 |
| 2010/0278012 | A1 * | 11/2010 | Tremper | G01S 7/523 367/102 |
| 2011/0099295 | A1 * | 4/2011 | Wegener | H03M 7/46 711/170 |
| 2011/0181459 | A1 * | 7/2011 | Feger | G01S 3/465 342/146 |
| 2011/0273964 | A1 * | 11/2011 | Agranat | A01M 31/002 367/135 |
| 2012/0220877 | A1 * | 8/2012 | Takeshima | H04N 19/136 367/87 |
| 2012/0307892 | A1 * | 12/2012 | Xu | H04N 19/44 375/E7.076 |
| 2012/0319876 | A1 * | 12/2012 | Froemmgen | H03M 7/4087 341/87 |
| 2013/0054681 | A1 * | 2/2013 | Coyne | G06Q 10/06 709/203 |
| 2013/0054861 | A1 * | 2/2013 | Tsirkin | G06F 13/28 710/266 |
| 2013/0242701 | A1 * | 9/2013 | Karl | G01S 7/003 367/93 |
| 2013/0243083 | A1 * | 9/2013 | Sezer | H04N 19/14 375/240.18 |
| 2015/0346321 | A1 * | 12/2015 | Jansen | H03M 7/30 342/107 |
| 2016/0033631 | A1 * | 2/2016 | Searcy | G01S 13/18 342/132 |
| 2016/0277766 | A1 * | 9/2016 | Xu | H04N 19/44 |
| 2018/0156911 | A1 * | 6/2018 | Pokrass | G01S 13/931 |
| 2018/0239808 | A1 * | 8/2018 | Koochakzadeh | G06F 16/211 |
| 2019/0121794 | A1 * | 4/2019 | Stute | G06F 16/24554 |
| 2019/0137602 | A1 * | 5/2019 | Longman | G01S 13/32 |
| 2019/0227156 | A1 * | 7/2019 | Santra | G01S 13/42 |
| 2019/0377062 | A1 * | 12/2019 | Barkan | G01S 13/536 |
| 2020/0003864 | A1 * | 1/2020 | Chi | G01S 13/56 |
| 2020/0044361 | A1 * | 2/2020 | Kishigami | G01S 13/42 |
| 2020/0244283 | A1 * | 7/2020 | Constantinescu | G16B 50/50 |
| 2021/0278983 | A1 * | 9/2021 | Xiao | G06F 3/0689 |
| 2021/0349203 | A1 * | 11/2021 | Will | G01S 13/726 |
| 2021/0396840 | A1 * | 12/2021 | Bekooij | G01S 13/723 |
| 2022/0197972 | A1 * | 6/2022 | Hayashi | G06N 3/063 |

FOREIGN PATENT DOCUMENTS

| | | | |
|---|---|---|---|
| CN | 102395899 B | 6/2014 | |
| CN | 103108182 B | 11/2015 | |
| CN | 102597948 B | 4/2016 | |
| CN | 103901405 B | 5/2016 | |
| CN | 104035079 B | 7/2016 | |
| CN | 105035079 B | 10/2017 | |
| EP | 0779742 B1 | 5/2002 | |
| EP | 2477401 A2 * | 7/2012 | G09G 5/001 |
| EP | 2937794 A1 * | 10/2015 | G06F 17/30575 |
| EP | 2950451 A1 * | 12/2015 | G01S 13/02 |
| EP | 2324639 B1 * | 4/2019 | H04N 19/174 |
| EP | 3859506 A1 * | 8/2021 | G06F 3/0607 |
| EP | 3589970 B1 * | 2/2023 | G01S 13/003 |
| GB | 2465755 A | 6/2010 | |
| JP | 2007025073 A | 2/2007 | |
| WO | 2006031737 A2 | 3/2006 | |
| WO | 2011041269 A2 | 4/2011 | |

OTHER PUBLICATIONS

"Exponential-Golomb Coding", Wikipedia, available at https://en.wikipedia.org/wiki/Exponential_Golomb_coding on Jan. 22, 2026, pp. 1-2.

"Frequency domain raw SAR data compression for multi-mode SAR Instruments", National Aerospace Laboratory (NLR), EUSAR 2006, May 16-18, 2006 (Year: 2006).

A. Ed Trotman, et al., "Compressing Inverted Files", Information Retrieval, Kluwer Academic Publishers, NL, vol. 6, No. 1, Jan. 1, 2003, pp. 5-19, XP002466310, ISSN: 1386-4564, doi: 10.1023/a:1022949613039, pp. 7.

EP Search Report, App. No. 16837718.2-1206/3338109, dated Aug. 18, 2021, 12 pgs.

National Intellectual Property Administration, PRC Search Report, China App. No. 2016800473159, 3 pgs.

Office Action T76178EP01.

* cited by examiner

SYSTEM AND METHOD FOR THE COMPRESSION OF ECHOLOCATION DATA

RELATED APPLICATIONS

This application hereby claims the benefit of and priority to Indian Provisional Patent Application Number 202141003802, titled "RADAR DATA COMPRESSION BY COMBINING RANGE FFT OUTPUT AND DISAMBIGUATING IN VELOCITY & ANGLE", filed on Jan. 27, 2021 and which is hereby incorporated by reference in its entirety.

TECHNICAL BACKGROUND

Echolocation devices detect objects by transmitting energy into space, then receiving echoes from objects or targets that reflect back a portion of the transmitted energy to receivers within the echolocation devices. Common echolocation devices include RADAR (RAdio Detection And Ranging), LIDAR (Light Detecting And Ranging), SONAR (Sound Navigation And Ranging), and ultrasonic devices.

All of these echolocation devices produce large amounts of data, that is then processed to identify a location and velocity of objects or targets within the range of the echolocation device. Storing and processing this echolocation data requires large amounts of computer memory and processor bandwidth.

OVERVIEW

In an implementation, a method for compressing echolocation data is provided. The method includes dividing the echolocation data into a plurality of partitions, and selecting a first partition for processing. The method also includes combining echolocation data from the first partition with echolocation data within a second partition, and combining echolocation data from the first partition with echolocation data within a third partition. The method further includes storing the combined echolocation data for all of the plurality of partitions except for the first partition in a memory.

In another implementation, a system for compressing echolocation data is provided. The system includes an input port configured to receive echolocation data, a memory configured to store echolocation data, and a processor coupled with the input port and the memory.

The processor is configured to divide the echolocation data into a plurality of partitions, and to select a first partition for processing. The processor is also configured to combine echolocation data from the first partition with echolocation data within a second partition, and to combine echolocation data from the first partition with echolocation data within a third partition. The processor is further configured to store the combined echolocation data for all of the plurality of partitions except for the first partition in the memory.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
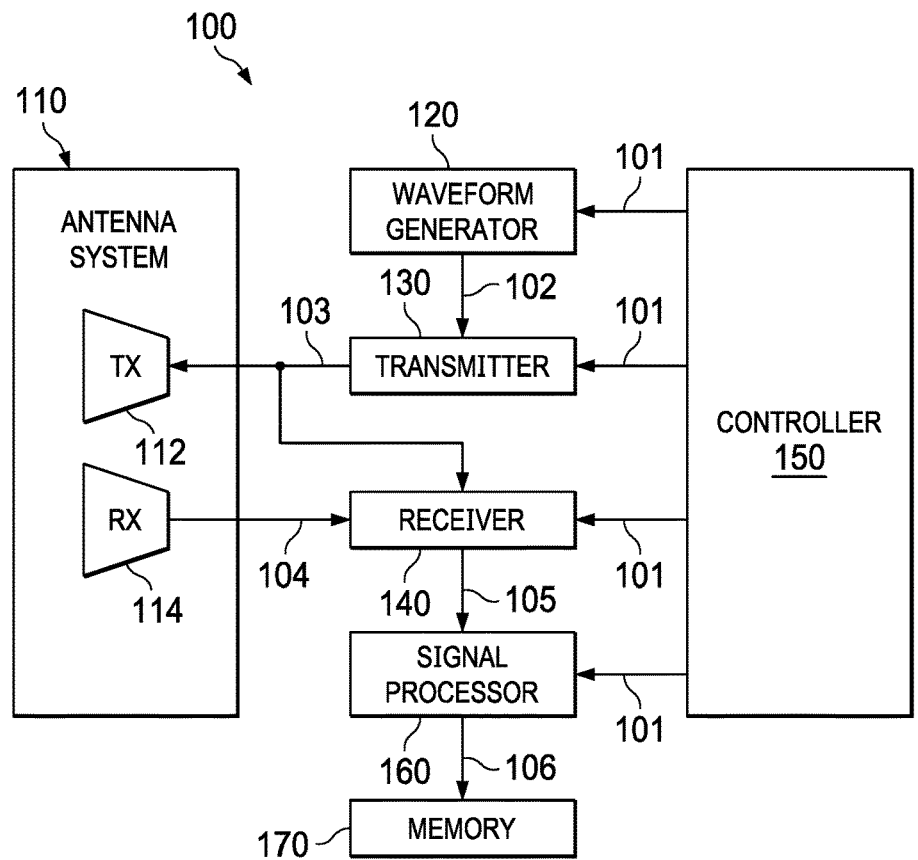
FIG. 1 illustrates an example embodiment of an echolocation system.

FIG. 1 illustrates an example embodiment of an echolocation system 100. In this example embodiment, a radar system in illustrated, however, LIDAR, SONAR, and ultrasound echolocation systems operate in a similar manner and comprise similar components.

In this example embodiment, echolocation system 100 includes antenna system 110, waveform generator 120, transmitter 130, receiver 140, controller 150, signal processor 160, and memory 170.

Controller 150 provides control signals to waveform generator 120, transmitter 130, receiver 140, and signal processor 160 over links 101 in order to direct them in their performance within echolocation system 100. These control signals may take any of a variety of configurations within the scope of the present invention.

Waveform generator 120 generates radio frequency (RF) "chirps", that in an example embodiment, are signals that ramp from 77 to 78 GHZ in 100 µs, and are repeated 512 times. These chirps are provided to transmitter 130 over link 102, and transmitter 130 then amplifies the chirps for transmission. Antenna system 110 includes a transmitter antenna 112 and a receiver antenna 114. Transmitter antenna 112 receives the amplified chirps from transmitter 130 over link 103 and transmits the amplified chirps into space for detection of objects or targets.

Receiver antenna 114 receives echoes of the transmitted chirps and transfers the received signals to receiver 140 over link 104. Receiver 140 converts the received signals to digital echolocation data and transfers the digital echolocation data to signal processor 160 over link 105 for processing and compressing. Signal processor 160 transfers the compressed data to memory 170 over link 106 for storage.

Figure 2A:
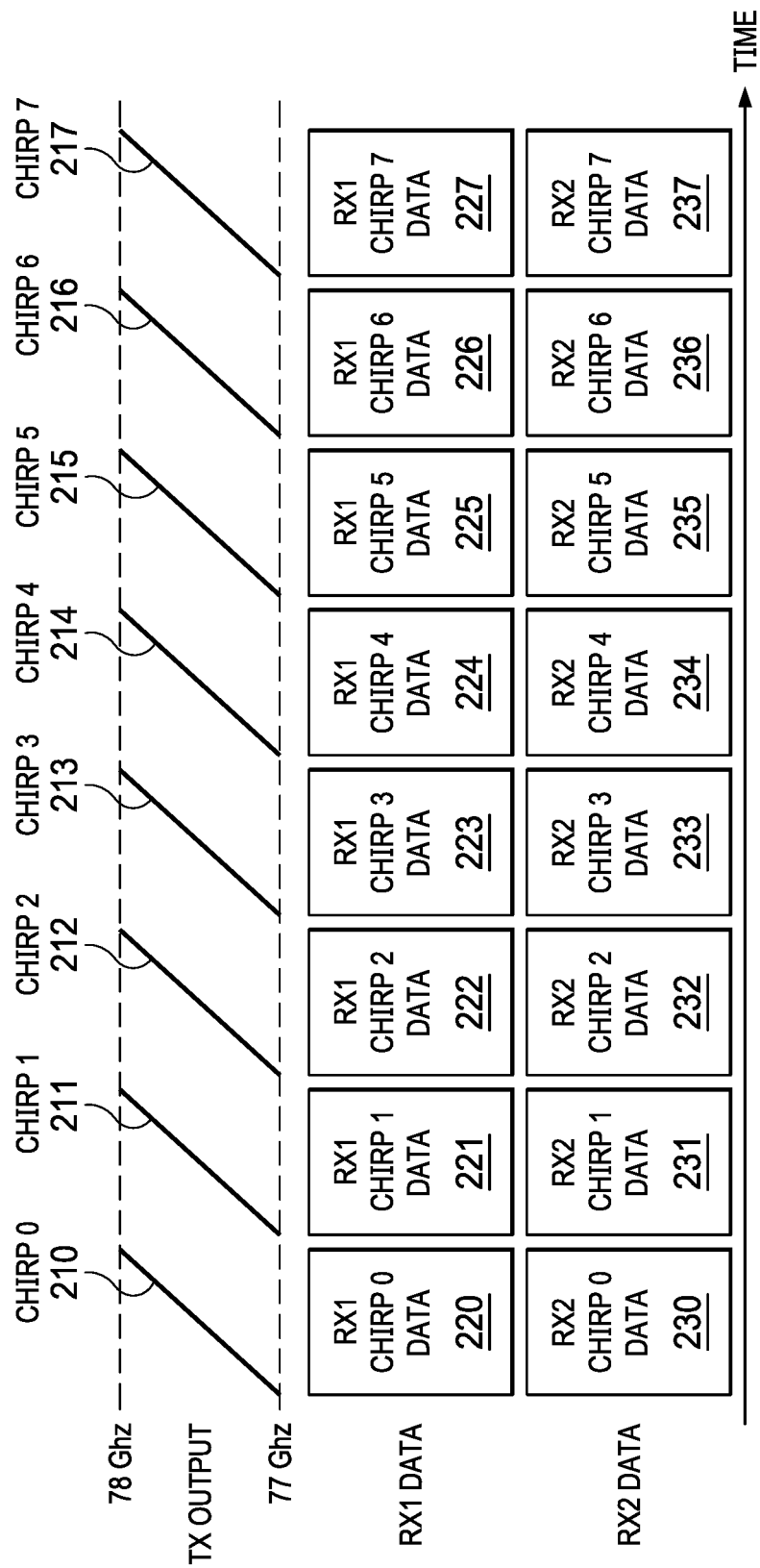
FIG. 2A illustrates example transmitted and received data within an example embodiment of an echolocation system.

FIG. 2A illustrates example transmitted and received data within an example embodiment of an echolocation system 100. In this example radar system, similar to that illustrated in FIG. 1, waveform generator 120 generates a series of 512 chirps, of which eight are illustrated here.

Chirps 0-7 210-217 each ramp from 77 to 78 GHz over 100 µs. These chirps are amplified by transmitter 130 and transmitted into space by transmitter antenna 112. In this example embodiment two receiver antennas 114 are provided, however other embodiments may use other quantities of receiver antennas 114 all within the scope of the present invention.

In this example embodiment, a first receiver receives RX1 data including RX1 Chirps 0-7 data 220-227, and a second receiver receives RX2 data including RX2 Chirps 0-7 data 230-237. This analog RF data is converted by receiver 140 into digital echolocation data which is then processed and compressed by signal processor 160.

In this example embodiment, echolocation system 100 transmits and receives reflected signals from 512 chirps. Receiver 140 mixes the transmitted and received signals and digitizes them with an analog-to-digital converter (ADC). Signal processor 160 performs three dimensions of Fast Fourier Transforms (FFTs) on the digital echolocation data.

A range FFT of received data produces an array of complex numbers (the array index is also referred to as a bin, such that the array has several bins). Each complex number (e.g., a+jb) has a magnitude value (defined as sqrt($a^2+b^2$)). If there is an object or target at a certain range, then the magnitude of the received data at a corresponding bin index (for example "bin1") is significantly larger than magnitudes of the received data at surrounding bin indices. In this example, bin1 is called a range FFT peak, and the occurrence of a FFT peak at a certain range bin typically indicates the presence of an object or target at that corresponding range. In this example embodiment, a range FFT of the received data produces a range bin index of FFT peaks corresponding to detected target ranges.

In an example embodiment where the echolocation system is configured to take 256 receive analog-to-digital converter (ADC) samples for each chirp and 512 chirps, these 256 samples per chirp are the input to the range FFT. The range FFT then creates one array of range FFT output having 256 elements for each chirp. This produces 512 such range FFT output arrays.

The first element of each of these arrays is used as an input for a doppler FFT to produce doppler FFT output for the first range bin. The second element of each of these arrays is used as in input for a doppler FFT to produce doppler FFT output for the second range bin. This process is continued through each of the range bins. Each bin now corresponds to a certain range and a certain doppler (or velocity). As above, each bin contains a complex number. If the magnitude for any bin is significantly higher than magnitudes of surrounding bins, it is termed a doppler FFT peak, and the occurrence of an FFT peak at a certain doppler bin (for a given range bin) typically indicates the presence of a target at that corresponding doppler and range combination.

Similar to the above discussion about the doppler FFT, the first element of each of these arrays is used as an input for an angle FFT to produce angle FFT output for the first range bin. The second element of each of these arrays is used as an input for an angle FFT to produce angle FFT output for the second range bin. This process is continued through each of the range bins. Each bin now corresponds to a certain range number, a certain velocity, and a certain angle. As above, each bin contains a complex number. If the magnitude for any bin is significantly higher than magnitudes of surrounding bins, it is termed an angle FFT peak, and the occurrence of an FFT peak at a certain angle bin (for a given range and doppler bin) typically indicates the presence of a target at that corresponding range, velocity, and angle combination. These three FFTs produce a three-dimensional data cube of echolocation data illustrated in FIG. 2B and described below.

Figure 2B:
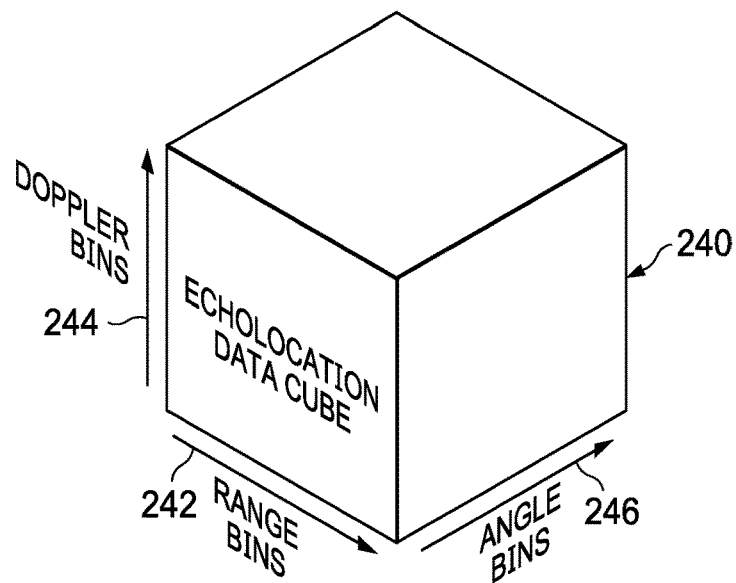
FIG. 2B illustrates echolocation data received within an example embodiment of an echolocation system.

FIG. 2B illustrates echolocation data received within an example embodiment of an echolocation system. As a result of the three FFTs performed by signal processor 160 on the digital echolocation data received from receiver 140, a quantity of echolocation data is produces that may be visualized as the three-dimensional data cube 240 illustrated here.

In this example embodiment, echolocation data cube 240 has a dimension of 256 range bins, a dimension of 512 doppler bins, and a dimension of eight angle bins. Each value of echolocation data is a complex number of the form X+jY. By determining the location within this echolocation data cube of peaks corresponding to a detected target, the target's range, velocity, and angle may be determined.

The target's range is determined by its position on the range axis, its velocity is determined by its position on the doppler axis, and its angle is determined by its position on the angle axis.

Frequency modulated continuous wave (FMCW) radar received data as described above in an echolocation data cube 240 requires large amounts of memory for storage. For example, if each data point includes 16 bits of data for X and 16 bits of data for Y (in the above complex number), a data cube comprising 256 range bins, 512 doppler bins, and 8 angle bins, would require 4 MB of storage. During ordinary operation, large quantities of these echolocation data cubes 240 are produced and must be stored for processing.

In order to optimize storage costs, various compression techniques may be performed on the echolocation data. For example, block floating point representation of samples and/or exponential Golomb coding of samples may be used to achieve compression of 25% to 50%. Other techniques include simultaneous transmission operation applications introducing different artificial doppler shifts for each transmitter to enable transmitter disambiguation during digital signal processing. These techniques result in compression of the echolocation data. Note that these techniques may be used in addition to the methods illustrated in FIGS. 3-5 and described below to achieve greater compression of the echolocation data.

FIGS. 3-5 illustrate example methods for the compression of echolocation data by partitioning the echolocation data, selecting a first partition, combining the data within the first partition with data within two other partitions, and storing the data for all but the first partition. Since one fewer partition of data is stored, this results in improved storage efficiency.

Figure 3A:
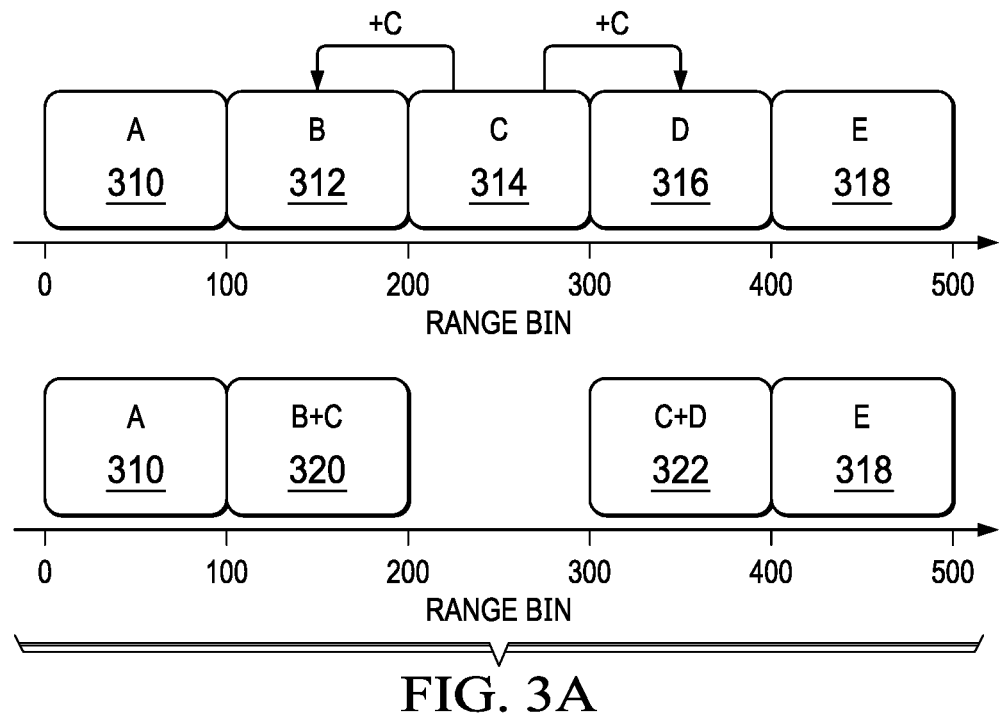
FIG. 3A illustrates an example method for the compression of echolocation data.

FIG. 3A illustrates an example method for the compression of echolocation data. In this example embodiment, signal processor 160 receives digital echolocation data from receiver 140, and performs a 500-point range FFT on the echolocation data resulting in 500 range bins. The echolocation data is partitioned into five partitions, each containing 100 range bins.

In this example, partition A 310 contains near targets with strong signals, and partition E 318 contains far targets with weak signals. In this example embodiment, partition C 314 is selected as the first partition for combination with second partition B 312 and third partition D 316. The contents of each of the 100 range bins within partition C 314 are combined with the contents of the corresponding range bin within partitions B 312 and D 316. In this example embodiment, each of the 100 range bins within partition C 314 is coherently added (note, these are complex numbers (e.g., a+jb is added to c+jd to produce x+jy)) to the corresponding range bin within partition B 312, and to the corresponding range bin within partition D 316. Other methods may be used to combine partition C 314 with partitions B 312 and D 316 (two such examples are discussed below), all within the scope of the present invention.

Partitions A 310, B+C 320, C+D 322, and E 318 are stored in memory. Since partition C 314 is not stored, this results in a 20% improvement in storage efficiency. The four stored partitions (A 310, B+C 320, C+D 322, and E 318) are then processed using standard 2-D radar processing with doppler FFTs on each of the 400 stored range bins, and standard target detection algorithms are used. This results in the compressed echolocation data illustrated in FIG. 3B.

Figure 3B:
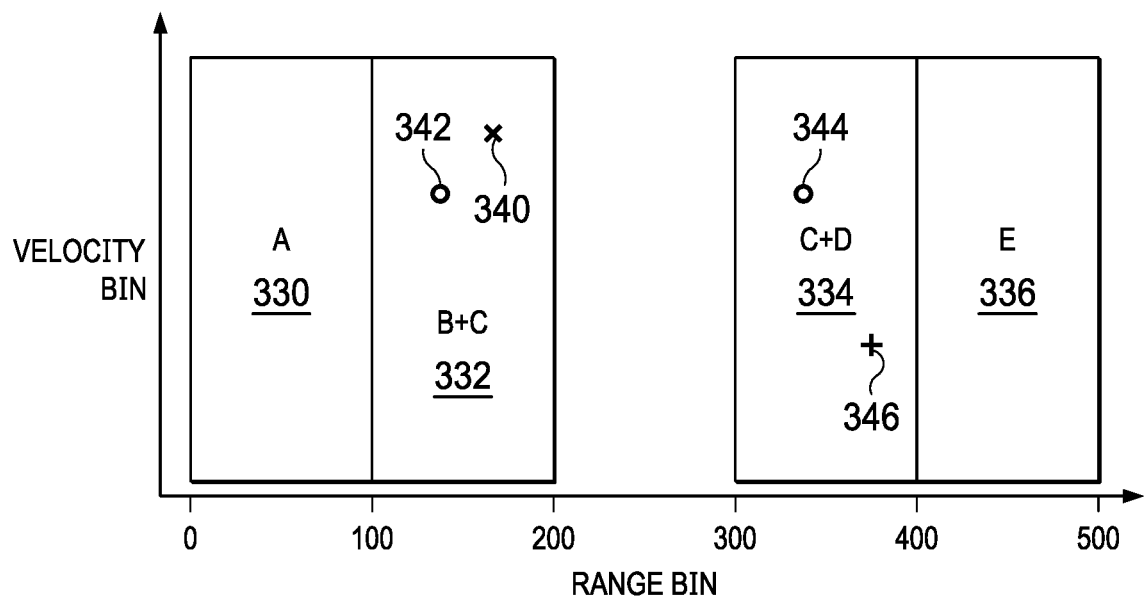
FIG. 3B illustrates an example method for the disambiguation of targets within compressed echolocation data.

FIG. 3B illustrates an example method for the disambiguation of targets within compressed echolocation data. After standard 2-D radar processing with doppler FFTs on each of the 400 stored range bins, peaks in the echolocation data indicate targets. The resulting echolocation data is illustrated here in 2D graphs. Exemplary echolocation data for the four partitions (A 330, B+C 332, C+D 334, and E 336) that were stored in the memory are illustrated. The horizontal axis illustrates the 400 stored range bins, and the vertical axis illustrates the 512 doppler bins (corresponding to the chirps).

Since partition C 314 has been combined (by coherent addition) with partitions B 312 and D 316, any target located in the range bins within partition C 314 will now be found within partitions B+C 320 and C+D 322, as illustrated by the targets in partitions B+C 332 and C+D 334 in FIG. 3B.

In this example, target 340 is found in a particular range and velocity bin in partition B+C 332 and not in the corresponding range and velocity bin in partition C+D 334, and target 346 is found in a particular range and velocity bin in partition C+D 334 and not in the corresponding range and velocity bin in partition B+C 332. This indicates that neither of these targets is actually from partition C, and target 340 belongs at the range bin corresponding to partition B 312, and target 346 belongs at the range bin corresponding to partition D 316.

Target 342 is found in a particular range and velocity bin in partition B+C 332, and a corresponding target 344 is found in a corresponding range and velocity bin in partition C+D 334. Since these two targets are found at the same location (with respect to range bin and velocity bin) in partitions B+C 332 and C+D 334, they most likely actually represent a single target from partition C 314 that was added to partitions B 312 and D 316.

It is possible that targets 342 and 344 are actually two distinct targets having the same velocity and found in the same relative range bin within partitions B 312 and D 316. In order to further disambiguate this case, additional tests, such as comparing the amplitude and phase of the target in partitions B+C 332 and C+D 334 may be performed to differentiate between a single target from partition C 314, and two similar targets from partitions B 312 and D 316.

While this method results in a 20% reduction of memory, there is a 3 dB signal-to-noise ratio loss in the combination of the partitions, and, as discussed above, there is some residual ambiguity in determining targets from partition C. In a worst-case scenario of a static scene where all objects have the same velocity (i.e., none), this residual ambiguity increases.

Figure 4A:
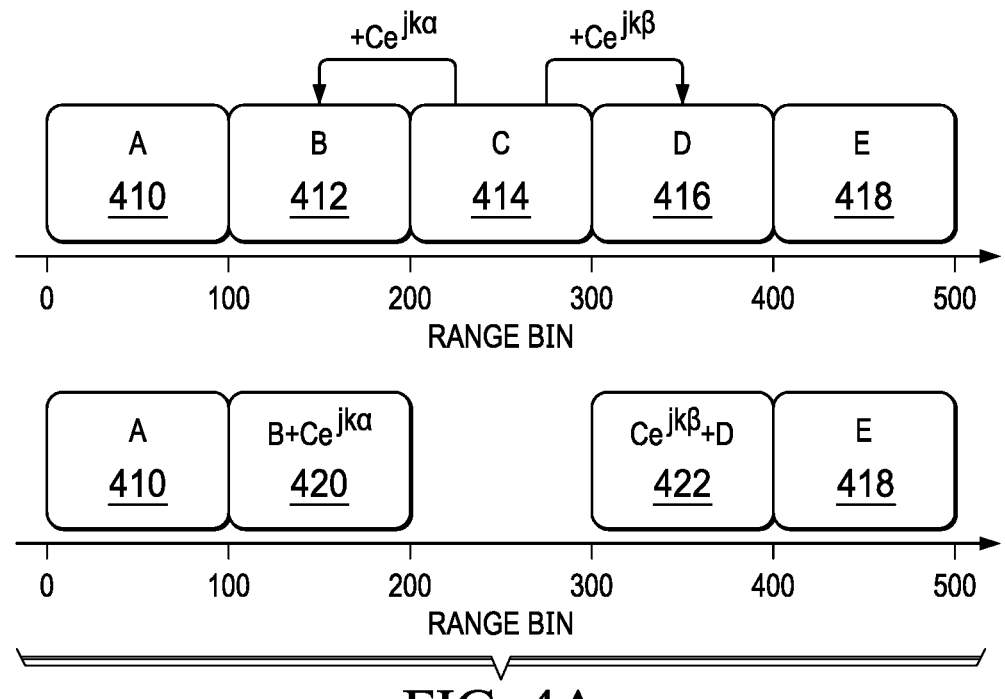
FIG. 4A illustrates an example method for the compression of echolocation data.

FIG. 4A illustrates an example method for the compression of echolocation data. In this example embodiment, signal processor 160 receives digital echolocation data from receiver 140, and performs a 500-point range FFT on the echolocation data resulting in 500 range bins. The echolocation data is partitioned into five partitions, each containing 100 range bins. In an example embodiment where 512 chirps are transmitted and received, range FFT output from successive chirps is collected.

In this example, partition A 410 contains near targets with strong signals, and partition E 418 contains far targets with weak signals. In this example embodiment, partition C 414 is selected as the first partition for combination with second partition B 412 and third partition D 416. The contents of each of the 100 range bins within partition C 414 are combined with the contents of each of the corresponding range bins within partitions B 412 and D 416.

In this example embodiment, the data for each of the 512 chirps within each range bin of region C 414 is multiplied by $e^{jk\alpha}$ (note, these are complex numbers), where e is Euler's number, j is the square root of −1, k is the chirp index from 0 to 511, and $\alpha$ is a constant, resulting in the addition of an artificial complex phase rotation to the echolocation data, and the result is coherently added (e.g., a+jb is added to c+jd to produce x+jy) to a corresponding range bin in partition B 412, resulting in combined partition B+C$e^{jk\alpha}$ 420. For each of the 512 chirps each range bin of region C 414 is multiplied by $e^{jk\beta}$, where e is Euler's number, j is the square root of −1, k is the chirp index from 0 to 511, and $\beta$ is a constant, resulting in the addition of an artificial complex phase rotation to the echolocation data, and the result is coherently added to a corresponding range bin in partition D 416, resulting in combined partition C$e^{jk\beta}$+D 420.

Partitions A 410, B+C 420, C+D 422, and E 418 are stored in memory. Since partition C 414 is not stored, this results in a 20% improvement in storage efficiency. The four stored partitions (A 410, B+C$e^{jk\alpha}$ 420, C$e^{jk\beta}$+D 422, and E 418) are then processed using standard 2-D radar processing with doppler FFTs on each of the 400 stored range bins, and standard target detection algorithms are used. This results in the compressed echolocation data illustrated in FIG. 4B.

Figure 4B:
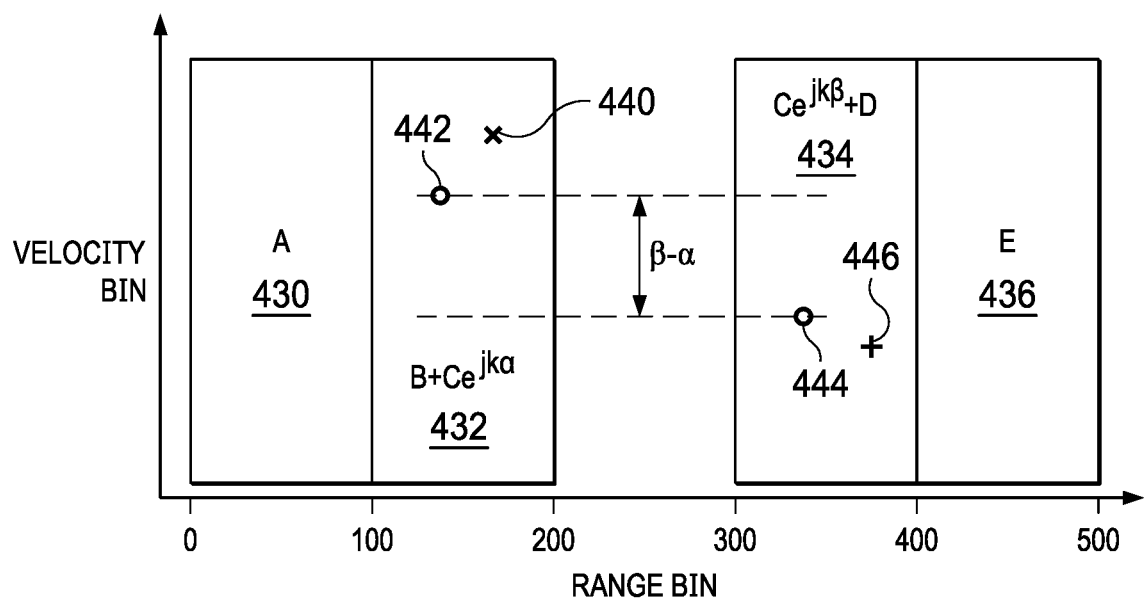
FIG. 4B illustrates an example method for the disambiguation of targets within compressed echolocation data.

FIG. 4B illustrates an example method for the disambiguation of targets within compressed echolocation data. After standard 2-D radar processing with doppler FFTs on each of the 400 stored range bins, peaks in the echolocation data indicate targets. The resulting echolocation data is illustrated here in 2D graphs. Exemplary echolocation data for the four partitions (A 430, B+C$e^{jk\alpha}$ 432, C$e^{jk\beta}$+D 434, and E 436) that were stored in the memory are illustrated. The horizontal axis illustrates the 400 stored range bins, and the vertical axis illustrates the 512 doppler bins (corresponding to the chirps).

Since partition C 414 has been combined with partitions B 412 and D 416, any target located in the range bins within partition C 414 will now be found within partitions B+C$e^{jk\alpha}$ 420 and C$e^{jk\beta}$+D 422, as illustrated by the targets in partitions B+C$e^{jk\alpha}$ 432 and C$e^{jk\beta}$+D 434 in FIG. 4B.

In this example, target 440 is found in a particular range and velocity bin in partition B+C$e^{jk\alpha}$ 432 and not in the corresponding range and velocity bin in partition C$e^{jk\beta}$+D 434, and target 446 is found in a particular range and velocity bin in partition C$e^{jk\beta}$+D 434 and not in the corresponding range and velocity bin in partition B+C$e^{jk\alpha}$ 432. This indicates that neither of these targets is actually from partition C, and target 440 belongs at the range bin corresponding to partition B 412, and target 446 belongs at the range bin corresponding to partition D 416.

Target 442 is found in a particular range and velocity bin in partition B+C$e^{jk\alpha}$ 432, and a corresponding target 444 is found in a corresponding range bin in partition C$e^{jk\beta}$+D 434, but with a difference in velocity equal to $\beta-\alpha$. Since these two targets are found at the same location (with respect to range bin) in partitions B+C$e^{jk\alpha}$ 432 and C$e^{jk\beta}$+D 434, and with the expected difference $(\beta-\alpha)$ in velocity, they most likely actually represent a single target from partition C 414 that was added to partitions B 412 and D 416.

It is possible that targets 442 and 444 are actually two distinct targets having the expected difference (β−α) in velocity and found in the same relative range bin within partitions B 412 and D 416. However, there is only a very small probability that the two targets would have exactly the expected difference in velocity, and in some embodiments, the values of α and β are changed between frames, such that the possibility of ambiguity is further reduced.

This solution can be easily extended by merging a larger quantity of range bins into one through Doppler division and use even less storage space. For example, the echolocation data may be partitioned into a larger plurality of partitions, and multiple partitions may be combined using the methods described here all within the scope of the present invention.

Figure 5A:
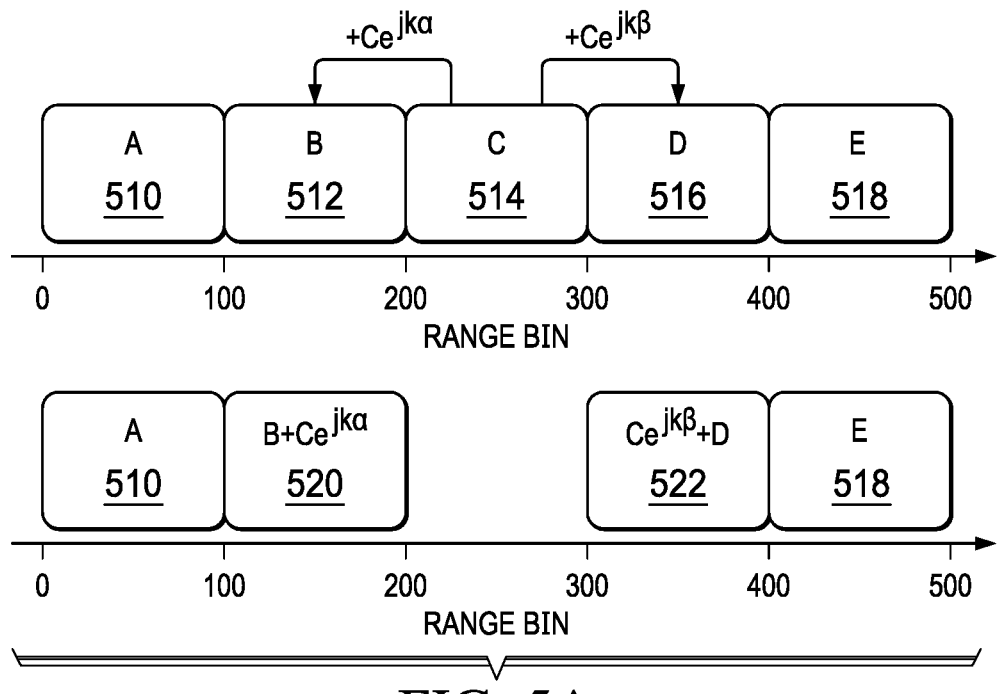
FIG. 5A illustrates an example method for the compression of echolocation data.

FIG. 5A illustrates an example method for the compression of echolocation data. In this example embodiment, signal processor 160 receives digital echolocation data from receiver 140, and performs a 500-point range FFT on the echolocation data resulting in 500 range bins. The echolocation data is partitioned into five partitions, each containing 100 range bins. In an example embodiment where eight receive antennas are utilized, range FFT output from successive receive antennas is collected.

In this example, partition A 510 contains near targets with strong signals, and partition E 518 contains far targets with weak signals. In this example embodiment, partition C 514 is selected as the first partition for combination with second partition B 512 and third partition D 516. The contents of each of the 100 range bins within partition C 514 are combined with the contents of each of the corresponding range bins within partitions B 512 and D 516.

In this example embodiment, the data for each of the eight receiver antennas within each range bin of region C 514 is multiplied by $e^{jk\alpha}$, where e is Euler's number, j is the square root of −1, k is the receiver index from 0 to 7, and α is a constant, resulting in the addition of an artificial complex phase rotation to the echolocation data, and the result is coherently added (e.g., a+jb is added to c+jd to produce x+jy) to a corresponding range bin in partition B 512, resulting in combined partition B+C$e^{jk\alpha}$ 520. For each of the eight receiver antennas each range bin of region C 514 is multiplied by $e^{jk\beta}$, where e is Euler's number, j is the square root of −1, k is the receiver index from 0 to 7, and β is a constant, resulting in the addition of an artificial complex phase rotation to the echolocation data, and the result is coherently added to a corresponding range bin in partition D 516, resulting in combined partition C$e^{jk\beta}$+D 520.

Partitions A 510, B+C 520, C+D 522, and E 518 are stored in memory. Since partition C 514 is not stored, this results in a 20% improvement in storage efficiency. The four stored partitions (A 510, B+C$e^{jk\alpha}$ 520, C$e^{jk\beta}$+D 522, and E 518) are then processed using standard 2-D radar processing with doppler FFTs on each of the 400 stored range bins, and standard target detection algorithms are used. This results in the compressed echolocation data illustrated in FIG. 5B.

Figure 5B:
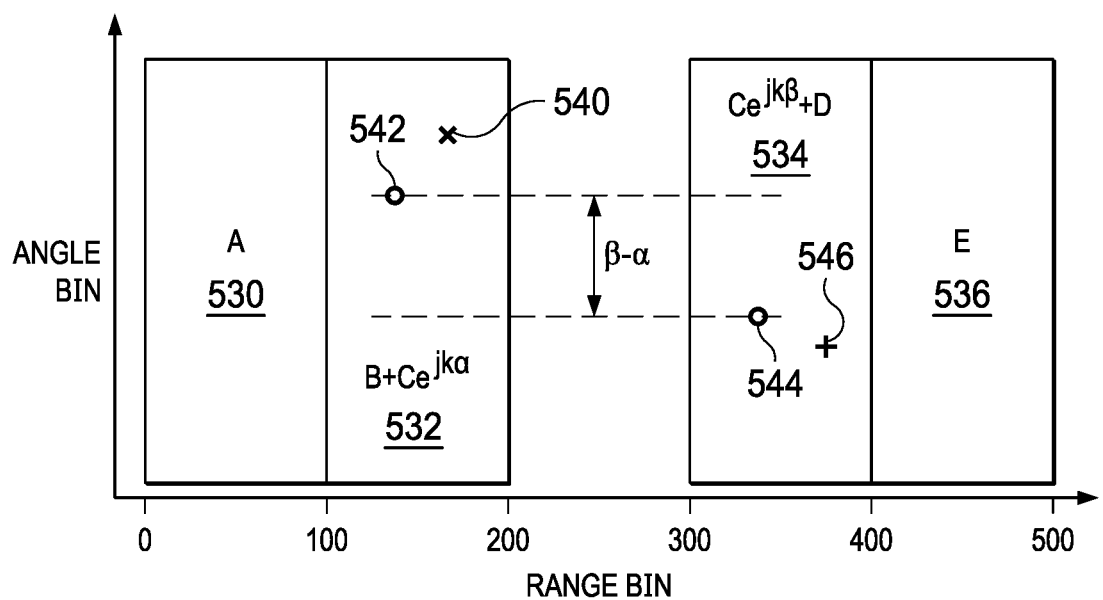
FIG. 5B illustrates an example method for the disambiguation of targets within compressed echolocation data.

FIG. 5B illustrates an example method for the disambiguation of targets within compressed echolocation data. After standard 2-D radar processing with angle FFTs on each of the 400 stored range bins, peaks in the echolocation data indicate targets. The resulting echolocation data is illustrated here in 2D graphs. Exemplary echolocation data for the four partitions (A 530, B+C$e^{jk\alpha}$ 532, C$e^{jk\beta}$+D 534, and E 536) that were stored in the memory are illustrated. The horizontal axis illustrates the 400 stored range bins, and the vertical axis illustrates the eight angle bins (corresponding to the receive antennas).

In this example embodiment, the targets angle or direction is given by an offset from the angle bin as detected in the B 512 or D 516 partition. The offset corresponds to the parameter α or β, in addition to the spacing between receiving antenna and the chirp wavelength. In this embodiment, FMCW radar processing technology is used to convert a phase change per receive antenna such as the parameter α or β into an angle or direction of an object or target in degrees.

In this example embodiment, targets are disambiguated through Angle of Arrival (AoA) division. In typical narrow-front radar applications angles of approximately −20° to +20° are covered. Wider angles are not expected and this example embodiment uses them for range expansion and storage reduction. This AoA modulation can also been seen as linearly increasing phase shift for each receive antenna.

Since partition C 514 has been combined with partitions B 512 and D 516, any target located in the range bins within partition C 514 will now be found within partitions B+C$e^{jk\alpha}$ 520 and C$e^{jk\beta}$+D 522, as illustrated by the targets in partitions B+C$e^{jk\alpha}$ 532 and C$e^{jk\beta}$+D 534 in FIG. 5B.

In this example, target 540 is found in a particular range and angle bin in partition B+C$e^{jk\alpha}$ 532 and not in the corresponding range and angle bin in partition C$e^{jk\beta}$+D 534, and target 546 is found in a particular range and angle bin in partition C$e^{jk\beta}$+D 534 and not in the corresponding range and angle bin in partition B+C$e^{jk\alpha}$ 532. This indicates that neither of these targets is actually from partition C, and target 540 belongs at the range bin corresponding to partition B 512, and target 546 belongs at the range bin corresponding to partition D 516.

Target 542 is found in a particular range and angle bin in partition B+C$e^{jk\alpha}$ 532, and a corresponding target 544 is found in a corresponding range bin in partition C$e^{jk\beta}$+D 534, but with a difference in angle equal to β−α. Since these two targets are found at the same location (with respect to range bin) in partitions B+C$e^{jk\alpha}$ 532 and C$e^{jk\beta}$+D 534, and with the expected difference (β−α) in angle, they most likely actually represent a single target from partition C 514 that was added to partitions B 512 and D 516.

It is possible that targets 542 and 544 are actually two distinct targets having the expected difference (β−α) in angle and found in the same relative range bin within partitions B 512 and D 516. However, there is only a very small probability that the two targets would have exactly the expected difference in angle, and in some embodiments, the values of α and β are changed between frames, such that the possibility of ambiguity is further reduced.

Figure 6:
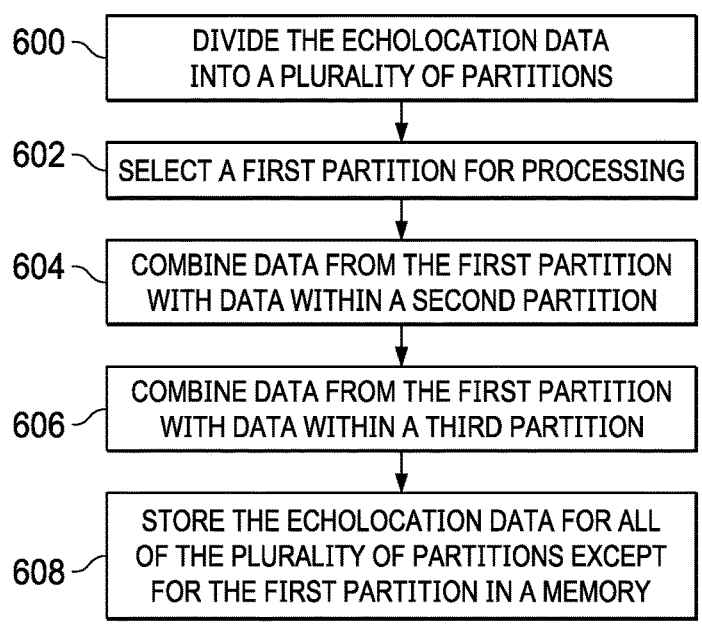
FIG. 6 is a flowchart illustrating an example embodiment of a method for compressing echolocation data.

FIG. 6 is a flowchart illustrating an example embodiment of a method for compressing echolocation data. In this example method signal processor 160 divides the echolocation data into a plurality of partitions, (operation 600).

Signal processor 160 then selects a first partition for processing, (operation 602). Signal processor 160 combines data from the first partition with data within a second partition, (operation 604). Signal processor 160 also combines data from the first partition with data within a third partition, (operation 604).

Signal processor 160 stores the echolocation data for all of the partitions except for the data from the first partition within a memory 170, (operation 608).

Figure 7:
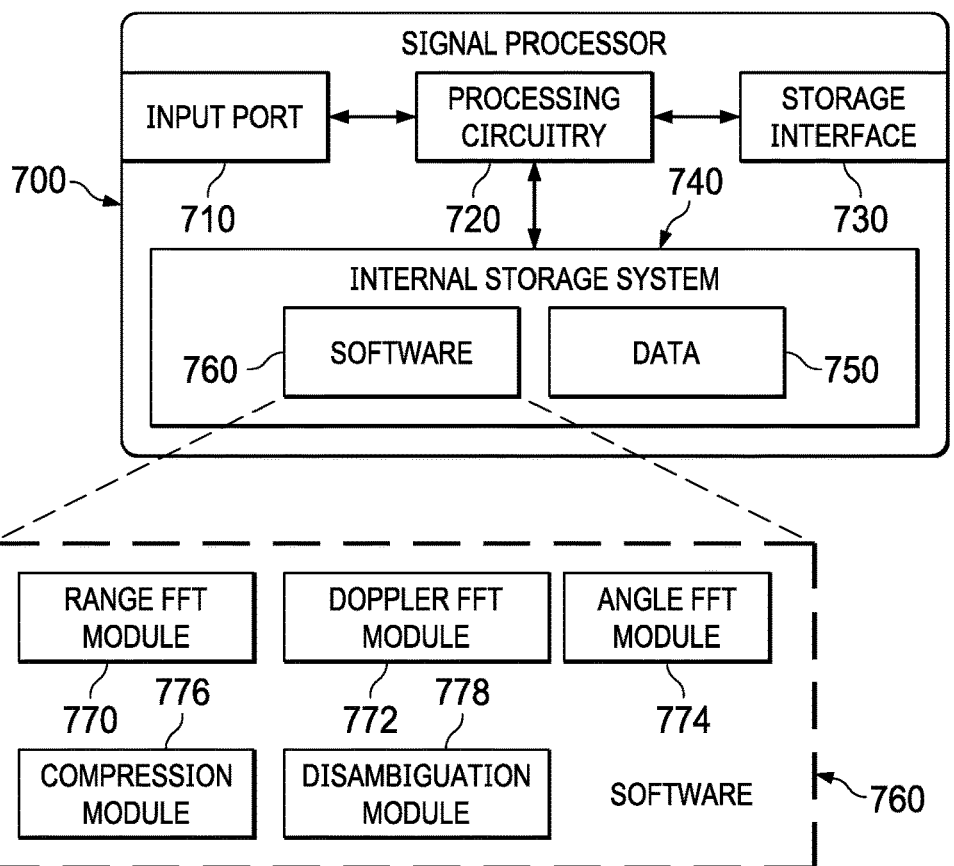
FIG. 7 illustrates an example embodiment of a signal processor within an echolocation system.

FIG. 7 illustrates an example embodiment of a signal processor 700 within an echolocation system 100. As discussed above, signal processor 700 may take on any of a wide variety of configurations. Here, an example configuration is provided for a signal processor 160 within an echolocation system 100 implemented as an ASIC. However, in other examples, signal processor 700 may be built into an echolocation system 100 or controller 150, or into a host system.

In this example embodiment, signal processor 700 comprises input port 710, processing circuitry 720, storage interface 730, and internal storage system 740. Input port 710 comprises circuitry configured to receive data from a receiver 140 and commands from a controller 150. Storage interface 730 comprises circuitry configured to send data and commands to an external storage system or memory 170 and to receive data from the storage system or memory 170.

Processing circuitry 720 comprises electronic circuitry configured to perform the tasks of an echolocation signal processor 160 as described above. Processing circuitry 720 may comprise microprocessors and other circuitry that retrieves and executes software 760. Processing circuitry 720 may be embedded in an echolocation system 100 in some embodiments. Examples of processing circuitry 720 include general purpose central processing units, application specific processors, and logic devices, as well as any other type of processing device, combinations, or variations thereof. Processing circuitry 720 can be implemented within a single processing device but can also be distributed across multiple processing devices or sub-systems that cooperate in executing program instructions.

Internal storage system 740 can comprise any non-transitory computer readable storage media capable of storing software 760 that is executable by processing circuitry 720. Internal storage system 720 can also include various data structures 750 which comprise one or more databases, tables, lists, or other data structures, including the data buffer used to temporarily store the echolocation data for compression. Storage system 740 can include volatile and nonvolatile, removable and non-removable media implemented in any method or technology for storage of information, such as computer readable instructions, data structures, program modules, or other data.

Storage system 740 can be implemented as a single storage device but can also be implemented across multiple storage devices or sub-systems co-located or distributed relative to each other. Storage system 740 can comprise additional elements, such as a controller, capable of communicating with processing circuitry 720. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 760 can be implemented in program instructions and among other functions can, when executed by signal processor 700 in general or processing circuitry 720 in particular, direct signal processor 700, or processing circuitry 720, to operate as described herein for a signal processor 160 within an echolocation system 100. Software 760 can include additional processes, programs, or components, such as operating system software, database software, or application software. Software 760 can also comprise firmware or some other form of machine-readable processing instructions executable by elements of processing circuitry 720.

In at least one example implementation, the program instructions include range FFT module 770, doppler FFT module 772, angle FFT module 774, compression module 776, and disambiguation module 778.

Range FFT module 770 provides instructions to processing circuitry 720 for use in performing range FFT operations on echolocation data. Doppler FFT module 772 provides instructions to processing circuitry 720 for use in performing doppler FFT operations on echolocation data. Angle FFT module 774 provides instructions to processing circuitry 720 for use in performing angle FFT operations on echolocation data.

Compression module 776 provides instructions to processing circuitry 720 for use in performing compression operations on echolocation data. Disambiguation module 778 provides instructions to processing circuitry 720 for use in disambiguating objects or targets within the compressed echolocation data into their correct range bins.

In general, software 760 can, when loaded into processing circuitry 720 and executed, transform processing circuitry 720 overall from a general-purpose computing system into a special-purpose computing system customized to operate as described herein for a signal processor 160 within an echolocation system 100, among other operations. Encoding software 760 on internal storage system 740 can transform the physical structure of internal storage system 740. The specific transformation of the physical structure can depend on various factors in different implementations of this description. Examples of such factors can include, but are not limited to the technology used to implement the storage media of internal storage system 740 and whether the computer-storage media are characterized as primary or secondary storage.

For example, if the computer-storage media are implemented as semiconductor-based memory, software 760 can transform the physical state of the semiconductor memory when the program is encoded therein. For example, software 760 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. A method comprising:
   receiving signals resulting from transmitted chirps, each identified by an index; and
   for echolocation data resulting from a particular chirp of the transmitted chirps:
   dividing the echolocation data into a plurality of partitions;
   selecting a first partition, of the plurality of partitions, for processing;
   multiplying echolocation data from the first partition by first and second complex numbers, respectively, to generate first resulting echolocation data and second resulting echolocation data, respectively, wherein each of the first and second complex numbers is a function of the index of the particular chirp;

adding the first resulting echolocation data to echolocation data within a second partition of the plurality of partitions, and adding the second resulting echolocation data to echolocation data within a third partition of the plurality of partitions, such that no echolocation data remains in the first partition; and
storing combined echolocation data for the second and third partitions of the plurality of partitions in a memory.

2. The method of claim 1, wherein the echolocation data comprises range dimension Fast Fourier Transform (FFT) processed data.

3. A method comprising:
receiving, by a plurality of receivers, each identified by an index, signals resulting from transmitted chirps; and
for echolocation data corresponding to signals received by a particular receiver of the plurality of receivers:
dividing the echolocation data into a plurality of partitions;
selecting a first partition, of the plurality of partitions, for processing;
multiplying echolocation data from the first partition by first and second complex numbers, respectively, to generate first resulting echolocation data and second resulting echolocation data, respectively, wherein each of the first and second complex numbers is a function of the index of the particular receiver;
adding the first resulting echolocation data to echolocation data within a second partition of the plurality of partitions, and adding the second resulting echolocation data to echolocation data within a third partition of the plurality of partitions, such that no echolocation data remains in the first partition; and
storing combined echolocation data for the second and third partitions in a memory.

4. The method of claim 2, wherein:
the first complex number is $e^{jk\alpha}$, wherein e is Euler's number, j is the square root of −1, k is the index of the particular chirp, and $\alpha$ is a constant; and
the second complex number is $e^{jk\beta}$, wherein $\beta$ is a constant.

5. The method of claim 4, further comprising:
processing the stored combined echolocation data using a Doppler FFT to produce Doppler FFT data;
processing the Doppler FFT data to detect maximums within the Doppler FFT data corresponding to echolocation targets based at least in part on their range and velocity;
classifying echolocation targets detected within the second partition but not the third partition as echolocation targets within the second partition;
classifying echolocation targets detected within the third partition but not the second partition as echolocation targets within the third partition; and
classifying echolocation targets detected within both the second partition and the third partition as echolocation targets within the first partition if a velocity offset between the echolocation target detected in the third partition and the corresponding echolocation target detected in the second partition is equal to $\beta-\alpha$.

6. The method of claim 3, wherein:
the first complex number is $e^{jk\alpha}$, wherein e is Euler's number, j is the square root of −1, k is the index of the particular receiver, and $\alpha$ is a constant; and
the second complex number is $e^{jk\beta}$, wherein $\beta$ is a constant.

7. The method of claim 6, further comprising:
processing the stored combined echolocation data using an angle FFT to produce angle FFT data;
processing the angle FFT data to detect maximums within the angle FFT data corresponding to echolocation targets based at least in part on their range and angle;
classifying echolocation targets detected within the second partition but not the third partition as echolocation targets within the second partition;
classifying echolocation targets detected within the third partition but not the second partition as echolocation targets within the third partition; and
classifying echolocation targets detected within both the second partition and the third partition as echolocation targets within the first partition if an angle offset between the echolocation target detected in the third partition and the corresponding echolocation target detected in the second partition is equal to $\beta-\alpha$.

8. The method of claim 1, wherein the echolocation data comprises radar data.

9. The method of claim 1, wherein the echolocation data is ordered by range, and divided into the plurality of partitions based on range of the echolocation data.

10. The method of claim 9, wherein the second partition and the third partition are adjacent to the first partition based on range of the echolocation data.

11. A system comprising:
a plurality of receivers, each identified by an index, configured to receive signals resulting from transmitted chirps;
a memory; and
a processor coupled to the plurality of receivers and the memory, the processor configured to, for echolocation data corresponding to signals received by a particular receiver of the plurality of receivers:
divide the echolocation data into a plurality of partitions;
select a first partition, of the plurality of partitions, for processing;
multiply echolocation data from the first partition by first and second complex numbers, respectively, to generate first resulting echolocation data and second resulting echolocation data, respectively, wherein each of the first and second complex numbers is a function of the index of the particular receiver;
add the first resulting echolocation data to echolocation data within a second partition of the plurality of partitions, and adding the second resulting echolocation data to echolocation data within a third partition of the plurality of partitions, such that no echolocation data remains in the first partition; and
store combined echolocation data for the second and third partitions in the memory.

12. The system of claim 11, wherein the echolocation data comprises range dimension Fast Fourier Transform (FFT) processed data.

13. A system comprising:
receiving circuitry configured to receive signals resulting from transmitted chirps, each identified by an index;
a memory; and
a processor coupled to the receiving circuitry, the processor configured to, for echolocation data resulting from a particular chirp of the transmitted chirps:
multiply echolocation data from a first partition, of a plurality of partitions, by first and second complex numbers, respectively, to generate first resulting echolocation data and second resulting echolocation data, respectively, wherein each of the first and second complex numbers is a function of the index of the particular chirp;

add the first resulting to echolocation data within a second partition of the plurality of partitions, and adding the second resulting echolocation data to echolocation data within a third partition of the plurality of partitions, such that no echolocation data remains in the first partition; and store combined echolocation data for the second and third partitions in the memory.

14. The system of claim 12, wherein the first complex number is $e^{jk\alpha}$, wherein e is Euler's number, j is the square root of −1, k is the index of the particular receiver, and $\alpha$ is a constant; and the second complex number is $e^{jk\beta}$, wherein $\beta$ is a constant.

15. The system of claim 14, wherein the processor is further configured to:

process the stored combined echolocation data using a Doppler FFT to produce Doppler FFT data.

process the Doppler FFT data to detect maximums within the Doppler FFT data corresponding to echolocation targets based at least in part on their range and velocity;

classify echolocation targets detected within the second partition but not the third partition as echolocation targets within the second partition;

classify echolocation targets detected within the third partition but not the second partition as echolocation targets within the third partition; and classify echolocation targets detected within both the second partition and the third partition as echolocation targets within the first partition if a velocity offset between the echolocation target detected in the third partition and the corresponding echolocation target detected in the second partition is equal to $\beta-\alpha$.

16. The system of claim 13, wherein:

the first complex number is $e^{jk\alpha}$, wherein e is Euler's number, j is the square root of −1, k is the index of the particular chirp, and $\alpha$ is a constant; and the second complex number is $e^{jk\beta}$, wherein $\beta$ is a constant.

17. The system of claim 16, wherein the processor is further configured to:

process the stored combined echolocation data using an angle FFT to produce angle FFT data;

process the angle FFT data to detect maximums within the angle FFT data corresponding to echolocation targets based at least in part on their range and angle;

classify echolocation targets detected within the second partition but not the third partition as echolocation targets within the second partition;

classify echolocation targets detected within the third partition but not the second partition as echolocation targets within the third partition; and classify echolocation targets detected within both the second partition and the third partition as echolocation targets within the first partition if an angle offset between the echolocation target detected in the third partition and the corresponding echolocation target detected in the second partition is equal to $\beta-\alpha$.

18. The system of claim 11, wherein the echolocation data comprises radar data.

19. The system of claim 11, wherein the echolocation data is ordered by range, and divided into the plurality of partitions based on range of the echolocation data.

20. The system of claim 19, wherein the second partition and the third partition are adjacent to the first partition based on range of the echolocation data.

21. The method of claim 1, further comprising:

using the echolocation data within the second and third partitions to determine a target within the first partition.

* * * * *